United States Patent
Aksyuk et al.

(10) Patent No.: US 6,522,801 B1
(45) Date of Patent: Feb. 18, 2003

(54) MICRO-ELECTRO-OPTICAL MECHANICAL DEVICE HAVING AN IMPLANTED DOPANT INCLUDED THEREIN AND A METHOD OF MANUFACTURE THEREFOR

(75) Inventors: Vladimir A. Aksyuk, Piscataway; Sungho Jin, Millington; Jungsang Kim, Basking Ridge; Hareesh Mavoori, Piscataway; Flavio Pardo, New Providence; Ainissa Ramirez, Chatham, all of NJ (US)

(73) Assignees: Agere Systems Inc., Allentown, PA (US); Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/685,883

(22) Filed: Oct. 10, 2000

(51) Int. Cl.[7] .................................................. G02B 6/42
(52) U.S. Cl. .............................. 385/18; 385/16; 385/17
(58) Field of Search .............................. 385/18, 16, 17; 359/198, 245; 250/216

(56) References Cited

U.S. PATENT DOCUMENTS

| | | | |
|---|---|---|---|
| 5,867,297 A | * | 2/1999 | Kiang et al. ................ 359/198 |
| 6,256,430 B1 | * | 7/2001 | Jin et al. ..................... 385/17 |
| 6,278,812 B1 | * | 8/2001 | Lin et al. ..................... 385/18 |
| 6,288,821 B1 | * | 9/2001 | Aksyuk et al. ............. 359/223 |
| 6,292,600 B1 | * | 9/2001 | Goldstein et al. ............ 385/18 |
| 6,300,619 B1 | * | 10/2001 | Aksyuk et al. ............. 250/216 |
| 6,392,221 B1 | * | 5/2002 | Aksyuk et al. ............. 250/216 |

* cited by examiner

*Primary Examiner*—Brian Healy

(57) ABSTRACT

The present invention provides a micro-electro-mechanical system (MEMS) optical device. The micro-electro-mechanical system (MEMS) optical device includes a mirror having a substrate with an implanted light reflective optical layer thereover, and a mounting substrate on which the mirror is movably mounted. The inclusion of the dopant within the light reflective optical layer increases the tensile stress of the device and tends to correct the concave curvature of the mirror structure toward a desirably flat configuration.

59 Claims, 10 Drawing Sheets

MICRO-ELECTRO-OPTICAL MECHANICAL DEVICE HAVING AN IMPLANTED DOPANT INCLUDED THEREIN AND A METHOD OF MANUFACTURE THEREFOR

TECHNICAL FIELD OF THE INVENTION

The present invention is directed, in general, to an optical device and, more specifically, to a micro-electro-optical mechanical device having an implanted dopant included therein and a method of manufacture therefor.

BACKGROUND OF THE INVENTION

Optical communication systems typically include a variety of optical devices, for example, light sources, photo detectors, switches, cross connects, attenuators, mirrors, amplifiers, and filters. The optical devices transmit optical signals in the optical communications systems. Some optical devices are coupled to electro-mechanical structures, such as thermal actuators, forming an electro-mechanical optical device. The term electro-mechanical structure, as used herein, refers to a structure which moves mechanically under the control of an electrical signal.

Some electro-mechanical structures move the optical devices from a predetermined first position to a predetermined second position. Cowan, William D., et al., "Vertical Thermal Actuators for Micro-Opto-Electro-Mechanical Systems," SPIE, Vol. 3226, pp. 137–146 (1997), describes one such electro-mechanical structure useful for moving optical devices from the predetermined first positions to the predetermined second positions.

These micro-electro-mechanical systems (MEMS) optical devices often employ a periodic array of micro-machined mirrors, each mirror being individually movable in response to an electrical signal. For example, the mirrors can each be cantilevered and moved by an electrostatic, piezoelectric, magnetic, or thermal actuation. See articles by L. Y. Lin, et al., IEEE Photonics Technology Lett. Vol. 10, p. 525, 1998, R. A. Miller, et al. Optical Engineering Vol. 36, p. 1399, 1997, and by J. W. Judy et al., Sensors and Actuators, Vol. A53, p. 392, 1996, and U.S. patent applications Ser. No. 09/390,158, filed Sep. 3, 1999, now U.S. Pat. No. 6,392,281, Ser. No. 09/415,178, filed Oct. 8, 1999, now U.S. Pat. No. 6,300,619, Ser. No. 09/410,586, filed Oct. 1, 1999, now U.S. Pat. No. 6,288,821, and Ser. No. 09/197,800 filed Nov. 23, 1998, now U.S. Pat. No. 6,256,430, which are incorporated herein by reference.

The mirrors used in these optical devices are typically made up of a material which reflects light with high reflectivity at the desired operating wavelength of the light, for example at about the 1000–1600 nm wavelength range for the $SiO_2$ optical fiber-based telecommunication systems. Some examples of such reflective materials are gold, silver, rhodium, platinum, copper or aluminum. These reflective metal films typically have a thickness ranging from about 20 nm to about 2000 nm, and are deposited on a movable membrane substrate such as a silicon substrate. At least one adhesion-promoting bond layer is desirably added between the reflecting film and the substrate in order to prevent the reflecting film from getting peeled off. The fabrication of movable membrane structure in MEMS devices is well established and is typically based on silicon wafer processing.

However, such systems have certain disadvantages. For example, when a thin metal film is deposited on a rigid substrate, a tensile or compressive stress is often introduced in the film as well as in the substrate. This is due to a number of different reasons, such as a film-substrate mismatch in the coefficient of thermal expansion (CTE), a mismatch in the lattice parameter, nonequilibrium atomic arrangement in the film, inadvertent or intentional incorporation of impurity atoms, etc. The presence of such stresses tends to cause a variety of dimensional instability problems especially if the substrate is relatively thin, as is the case in the MEMS membranes which usually are only several-micrometers thick. Other examples of the dimensional problems in the MEMS mirror structure caused by the stress include: i) undesirable bowing of the mirror substrate (membrane), which results in a non-focused or non-parallel light reflection and an increased loss of optical signal, ii) time-dependent change in mirror curvature due to the creep or stress relaxation in the reflective metal film, bond layer or the membrane substrate, iii) temperature-dependent change in mirror curvature due to the altered stress states and altered CTE mismatch conditions in the metal film, bond layer, and membrane substrate materials with changing temperature.

For electro-optic devices such as the optical cross connect systems to be reliable and reproducible, the stability of the mirror curvature is imperative. This importance of mirror curvature stabilization has not received much attention in prior art electro-optic devices.

Accordingly, what is needed in the art is an electro-optic device, and a method of manufacture therefore, that does not encounter the stability problems associated with mirror curvature, as experienced in the prior art electro-optic devices.

SUMMARY OF THE INVENTION

To address the above-discussed deficiencies of the prior art, the present invention provides a micro-electro-mechanical system (MEMS) optical device. The micro-electro-mechanical system (MEMS) optical device includes a mirror having a substrate with an implanted light reflective optical layer thereover, and a mounting substrate on which the mirror is movably mounted. The inclusion of the implanted dopant within the light reflective optical layer increases the tensile stress of the device and tends to correct the concave curvature of the mirror structure toward a desirably flat configuration.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
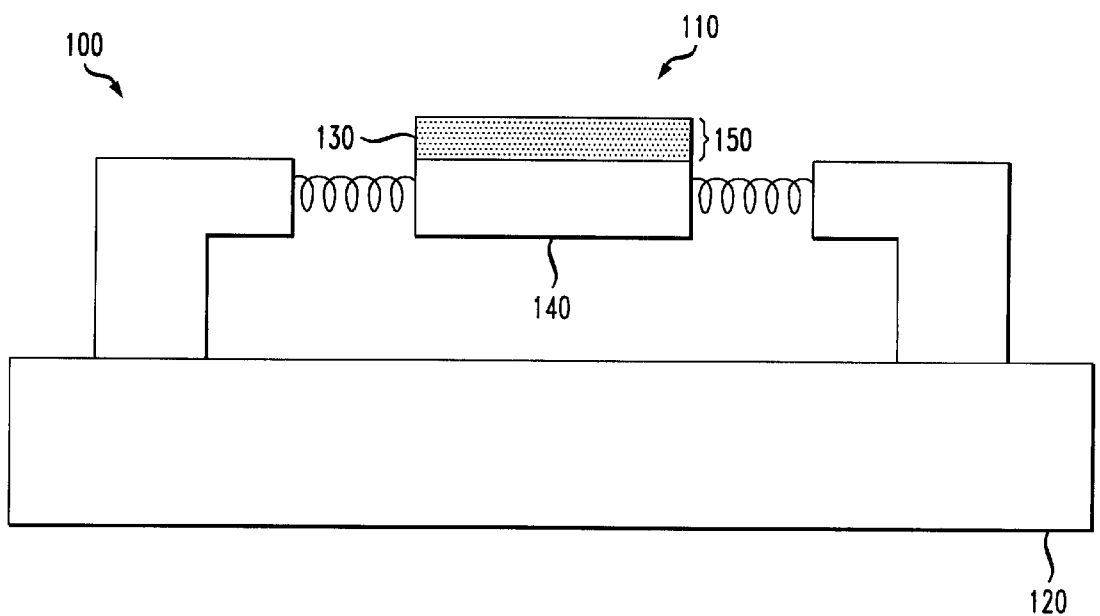
FIG. 1 illustrates an exemplary schematic cross-sectional description of stabilized mirror structure according to the invention.

Referring initially to FIG. 1, illustrated is one embodiment of a completed micro-electro-mechanical system (MEMS) optical device 100, which is in accordance with the present invention. As illustrated in FIG. 1, the optical device 100 includes a mirror 110 and a mounting substrate 120, on which the mirror 110 is moveably mounted. The mirror 110 comprises a light reflective optical layer 130 formed over a substrate 140. In the illustrative embodiment shown in FIG. 1, the light reflective optical layer 130 has a dopant 150 located therein. The inclusion of the implanted dopant 150 within the light reflective optical layer 130, and optionally the substrate 140, helps to substantially reduce initial mirror curvature. Moreover, the inclusion of the implanted dopant 150 within the light reflective optical layer 130, and optionally the substrate 140, also helps to substantially decrease the time or temperature-dependent changes of mirror curvature, such that the signal loss during operation of the micro-electro-mechanical system optical device 100, is minimized.

It should be specifically understood that the temperatures, atomic percentage and numerous dopants that are set forth herein are exemplary only, and the present invention is not intended to be limited to such temperatures, percentages or atomic species, but may vary, depending on the embodiment.

Figure 2:
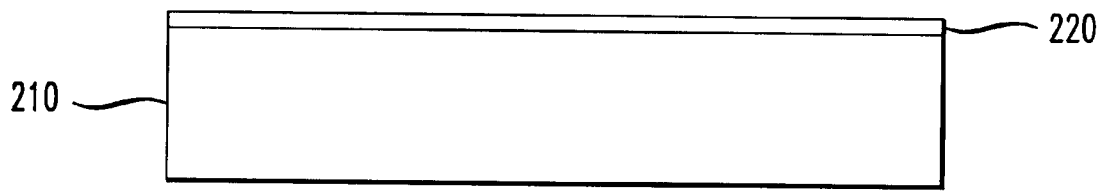
FIGS. 2–4 illustrate detailed manufacturing steps instructing how one might, in a preferred embodiment, manufacture the completed micro-electro-mechanical system optical device depicted in FIG. 1
Figure 3:
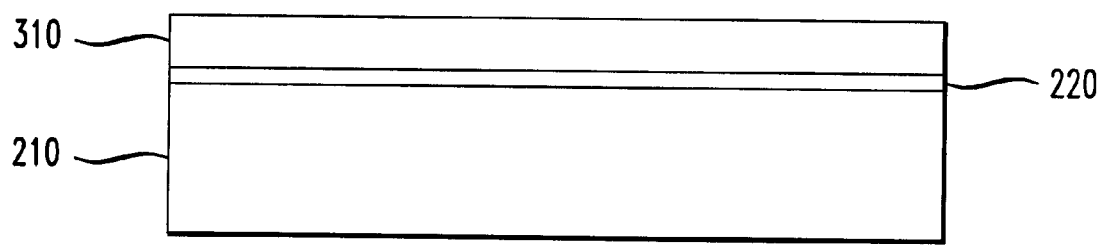
Figure 4:
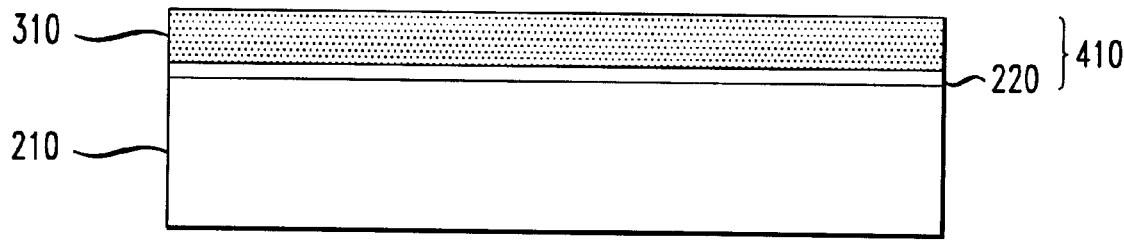

Turning to FIGS. 2–4, with continued reference to FIG. 1, illustrated are detailed manufacturing steps instructing how one might, in a preferred embodiment, manufacture the completed micro-electro-mechanical system optical device 100 depicted in FIG. 1. FIG. 2 illustrates a cross-sectional view of a partially completed MEMS optical device 200, including a mirror substrate 210. In an exemplary embodiment, the mirror substrate 210 is a polysilicon substrate, however, it should be noted that other similar substrates known to those who are skilled in the art could be used. For example, a poly silicon, singe crystal silicon, silicon nitride, silicon carbide, silicon oxide, diamond film, or any regional or layered combination of these materials may be used as the mirror substrate 210. Desirably formed over the mirror substrate 210, in an exemplary embodiment, may be a thin adhesion-promoting bond layer 220. The adhesion layer 220 may be formed using many processes, including known thin film deposition methods such as evaporation, sputtering, electrochemical deposition, or chemical vapor deposition. In one particularly advantageous embodiment of the invention, the adhesion layer 220 comprises titanium or chromium; however, the adhesion layer 220 is not limited to titanium or chromium, and other materials are within the scope of the present invention. It should be noted that using the adhesion layer 220 is desirable because it helps to bond the mirror substrate 210 and a subsequently formed light reflective optical layer together. However, it should also be noted that it is not required for the micro-electro-mechanical system optical device 200 to operate.

Turning to FIG. 3, illustrated is the formation of a light reflective optical layer 310 over the mirror substrate 210. In the specific embodiment shown in FIG. 3, the light reflective optical layer 310 is formed directly on the adhesion layer 220, which is formed directly on the mirror substrate 210. The light reflective optical layer 310 may comprise any material that is generally known to reflect light. In one advantageous embodiment, the light reflective optical layer 310 is a metal light reflective optical layer. In such an embodiment, the metal may comprise any metallic material that reflects light with high reflectivity. For example, in a preferred embodiment the light reflective optical layer 310 may comprise gold, silver, rhodium, platinum, copper or aluminum. The light reflective optical layer 310 may be formed using many processes. For instance, the light reflective optical layer 310 can be deposited by known thin film deposition methods such as evaporation, sputtering, electrochemical deposition, or chemical vapor deposition. Moreover, the light reflective optical layer 310 is typically formed to a thickness ranging from about 20 nm to about 2000 nm.

Turning to FIG. 4, illustrated is the partially completed MEMS optical device 200 illustrated in FIG. 3, after implanting a dopant 410 (e.g., atomic species) within the light reflective optical layer 310. It should be noted that implanting may include dopants implanted by ion implantation, or in other embodiments, may include dopants positioned within the substrate by other doping processes. In another embodiment, a blanket ion implantation process, or a shadow mask or lithographic patterning process could be used to implant the entire light reflective optical layer 310 or preselected regions of the light reflective optical layer 310. In the illustrative embodiment shown in FIG. 4, the dopant 410 is also located at least partially within the mirror substrate 210. Depending on the implantation conditions, the dopant 410 may be present as isolated embedded atoms in the light reflective optical layer 310, and mirror substrate 210 if included therein. Alternatively, the dopant 410 can be present as clusters or precipitates in the size range of about 1 nm to about 1000 nm, and preferably in the range from about 1 nm to about 100 nm. The introduction of optimally larger dopant 410 particles, most preferably having an average diameter ranging from about 5 nm to about 50 nm, can be facilitated by optional, post-implantation heat treatments. These sizes may enhance the precipitation strengthening effect, as the plastic deformation by dislocation movement becomes more difficult near the optimized particle size. Furthermore, the precipitates may comprise the implanted atoms only, or possibly the atoms of the host material, as well if intermetallic compounds can be formed.

The implanted dopant may be selected from many elements in the periodic table. For the sake of maximum strengthening, preferred elements are those with minimum solid solubility in the light reflective optical layer 310, and mirror substrate 210 if included therein. The desired solid solubility of the dopant at about 300° C. or less, may be less than about 3 atomic percent, preferably less than about 1 atomic percent, and even more preferably less than about 0.3 atomic percent. Thus, the type of dopant 150 is preferably selected depending on the light reflective optical layer 310 used, for example gold, silver, rhodium, platinum, copper or aluminum.

In the case of implanting a dopant species within a gold light reflective optical layer 310, the desired dopant species should have a solid solubility of less than about 1 atomic percent, and preferably less than about 0.3 atomic percent at temperatures of about 300° C. Dopants that accommodate this small solid solubility include some substitutional elements, which in principle substantially takes up the lattice atom position in the gold light reflective optical layer 310, such as silicon, bismuth, strontium, barium, cadmium, tungsten, iridium, rhenium, rhodium, ruthenium, cobalt, sulfur, selenium, tellurium, chlorine, iodine and phosphorous. Other dopants that accommodate the desired small solid solubility include some selected elements in the rare earth group, such as cerium, europium, erbium, lanthanum, neodymium, samarium, and terbium, and gas atoms such as helium, neon, argon and krypton. In the case of implanting interstitial atom species, which generally takes up interstitial sites in the host material, the desired implantable species with desirably very little solid solubility in gold include boron, carbon, nitrogen, oxygen, fluorine and hydrogen. Other elements which have somewhat larger, but still not excessive solid solubility, such as germanium, molybdenum and antimony, may also be used, but are less preferable. Reactive elements such as sodium, potassium and rubidium should be avoided even though they have very little solid solubility in gold. Likewise, elements which exhibit relatively high solid solubility in gold, for example, more than about 3 atomic percent, should be avoided, as their relative value of gold strengthening effect versus the inevitable loss of optical reflectivity by the presence of large number of these solute atoms in the gold light reflective optical layer 310, is diminishing. These undesirable or less preferable elements include silver, aluminum, cadmium, chromium, copper, iron, gallium, hafnium, indium, lithium, magnesium, manganese, niobium, nickel, palladium, platinum, scandium, tin, tantalum, titanium, vanadium, zinc, and zirconium, and some of the rare earth elements, such as dysprosium, gadolinium, holmium, lutetium and ytterbium.

In the case of using a silver light reflective optical layer 310, the desired low-solubility substitutional dopant for ion implantation to stabilize the mirror structure include silicon, bismuth, strontium, barium, cadmium, chromium, tungsten, nickel, iridium, molybdenum, niobium, rhenium, rhodium, ruthenium, osmium, vanadium, cobalt, sulfur, selenium, tellurium, chlorine, phosphorous, hydrogen, helium, neon, argon and krypton, and some selected rare earth elements including cerium, europium, gadolinium, lanthanum, neodymium, samarium, terbium, and yttrium. Desired interstitial species for ion implantation in silver based light reflective optical layer 310 include boron, carbon, nitrogen, and oxygen. The undesirable or less preferable, high-solubility species include copper, gold, gallium, indium, lithium, magnesium, manganese, lead, palladium, platinum, antimony, scandium, tin, titanium, and zinc, and rare earth elements with relatively higher solubility, such as dysprosium, erbium, holmium, lutetium and ytterbium.

In the case of using an aluminum light reflective optical layer 310, the desired low-solubility substitutional dopant for ion implantation to stabilize the mirror structure include gold, barium, bismuth, cadmium, cobalt, chromium, iron, germanium, silicon, hafnium, vanadium, indium, iridium, molybdenum, nickel, lead, titanium, tungsten, palladium, platinum, rhenium, rhodium, ruthenium, sulfur, selenium, tellurium, antimony, tin, strontium, helium, neon, argon, krypton, chlorine, iodine, and phosphorous, and some rare earth elements, such as cerium, dysprosium, erbium, europium, gadolinium, holmium, lanthanum, lutetium, neodymium, samarium, terbium, yttrium, and ytterbium. Desired interstitial species for ion implantation include boron, carbon, nitrogen, oxygen, fluorine and hydrogen. The species to avoid for ion implantation in aluminum based light reflective optical layer 310, include copper, gallium, lithium, magnesium, manganese, niobium, scandium, tantalum, zinc, zirconium, potassium, sodium, and rubidium. It should be noted that the use of same atomic species as the metal comprising the light-reflecting mirror layer itself (e.g., gold, silver and aluminum), as an implantation dopant element, is not precluded. In such a case, the insertion of extra atoms into the mirror material lattice creates defects and contributes to the strengthening of the metal layer.

Silicon ion ($Si^+$) implantation into the light reflective optical layer 310, including the gold, silver or aluminum light reflective optical layer 310, is particularly desirable for the following four reasons; i) the light reflective optical layer 310 has essentially no solid solubility for $Si^+$ atoms, which is good for electrical conductivity and hence for light reflection efficiency, as the reflectivity is often degraded with increasing solute content in the metal matrix, ii) the mechanical strengthening of the very soft light reflective optical layer 310 by $Si^+$, is far more efficient than other alloying elements, since the amount of undissolved $Si^+$ atoms available for precipitation hardening is maximized because of the very little solid solubility in the light reflective optical layer 310, iii) the surrounding micro-electro-mechanical system optical device 200 structural components, such as the mirror substrate 210, spring elements, $SiO_2$ or $Si_3N_4$ insulating layers, etc., often contain $Si^+$ already, so that unexpected structural or electrical changes are minimized, and thus a blanket ion implantation on the whole surface area, if desired, can be utilized without having to do the local patterning and masking procedures to restrict the ion implantation to the light reflective optical layer 310 areas only, and iv) $Si^+$ atoms are generally lighter than most of the transition metals or rare earth metals, and hence ion implantation penetration is also relatively easier.

The desired dose of ion implantation is dependent on the degree of needed mirror curvature change and that of needed mirror strengthening and stabilization as dictated by the application environment. For example, if the maximum temperature of exposure is higher, more stabilization of mirror curvature would be required. The typical dose of $Si^+$ ions for stabilization of the light reflective optical layer 310 is in the range of about 1E14 to about 1E18 ions/$cm^2$. However, in a preferred embodiment the dose of $Si^+$ ions ranges from about 1E15 to about 1E17 ions/$cm^2$, and even more preferably in the range from about 3E15 to about 3E16 ions/$cm^2$. Too small a dose of ion implantation could have negligible mirror stabilization effect while too much of a dose could cause excessive damage to the lattice structure and accompanying loss of light reflectivity. The $Si^+$ implant dose and the extraction voltage are carefully chosen so as to obtain a desired number of implanted atoms in the light reflective optical layer 310, adhesion layer 220, and the underlying mirror substrate 210. The desired number of implanted atoms in the light reflective optical layer 310 should range from about 1E15 atoms/cm$^3$ to less than about 1E22 atoms/cm$^3$. However, in an exemplary embodiment the desired number of implanted atoms in the light reflective optical layer 310 preferably ranges from about 1E17 atoms/cm$^3$ to about 1E20 atoms/cm$^3$.

Figure 5:
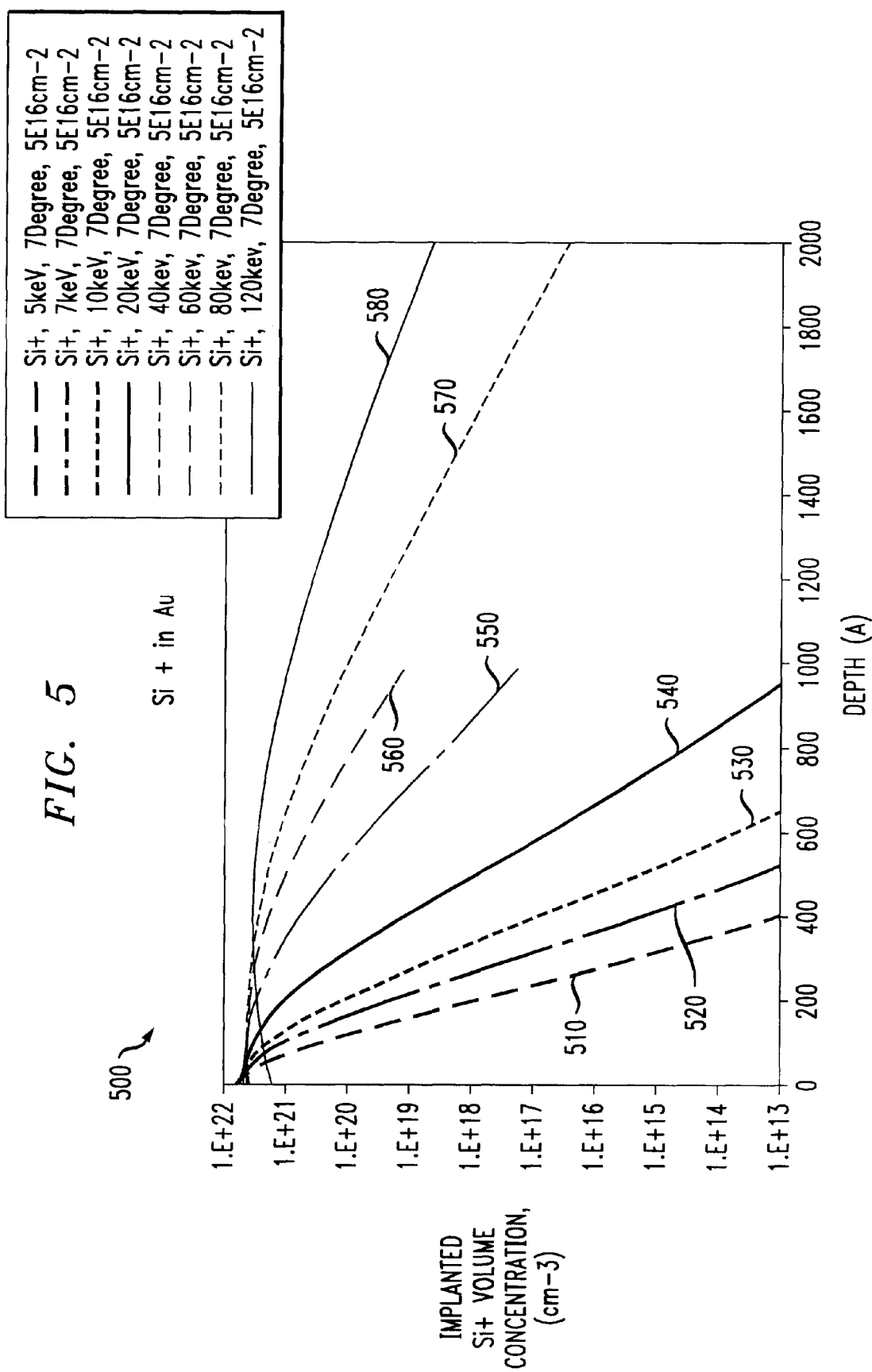
FIG. 5 illustrates the penetration depth profile of implanted Si ions into a gold mirror layer.

The desired extraction voltage for the ion implantation of Si$^+$ is typically in the range of about 2 KeV to about 1000 KeV, and preferably in the range from about 10 KeV to about 50 KeV. The penetration depth profile in ion implantation depends on the extraction voltage used. Shown in FIG. 5 is the penetration of implanted Si$^+$ ions in a gold matrix. As can be noticed, line 510 represents the penetration of the implanted Si$^+$ ions at 5 KeV, line 520 represents the penetration of the implanted Si$^+$ ions at 7 KeV, line 530 represents the penetration of the implanted Si$^+$ ions at 10 KeV, line 540 represents the penetration of the implanted Si$^+$ ions at 20 KeV, line 550 represents the penetration of the implanted Si$^+$ ions at 40 KeV, line 560 represents the penetration of the implanted Si$^+$ ions at 60 KeV, line 570 represents the penetration of the implanted Si$^+$ ions at 80 KeV, and line 580 represents the penetration of the implanted Si$^+$ ions at 80 KeV. In order to maximize the amount of Si$^+$ atoms in the gold light reflective optical layer 310, the extraction voltage for Si$^+$ ion implantation is selected to be about 40 KeV or less so that at least about 60% of the implanted atoms remain in the light reflective optical layer 310, with less than about 20%, but more than about 1%, of the ions remaining in the mirror substrate 210. However, in a preferred embodiment, at least about 90% of the implanted atoms remain in the light reflective optical layer 310.

The implantation is preferably done at a slight angle off the perpendicular direction in order to avoid non-uniform ion penetration into specific channels in the crystal lattice structure. The preferred angle of implantation is in the range of about 1 degree to about 30 degrees off the vertical axis. However, in an exemplary embodiment, the preferred angle ranges from about 3 degrees to about 10 degrees.

For the purpose of minimizing possible distortion, stressing, or damage of the micro-electro-mechanical structure optical device 200, excessive temperature exposure should be minimized. The speed of implantation, i.e., the number of ions inserted per unit time is desirably controlled so that the device surface temperature does not exceed a certain desired limit. For example, a surface temperature of less than about 400° C., and preferably less than about 150° C. is desired. Alternatively, the micro-electro-mechanical system optical device 200 may be contact-cooled during implantation by placing it on cold metal plate support or water cooled in order to minimize temperature rise of the device during the implantation.

Upon completion of the ion implantation, post-implantation heat treatments may be performed. Depending on the temperature and time of the post-implantation heat treatment, which provides a varying degree of atomic mobility, and the extent of movement, the implanted species may stay in the light reflective optical layer 310 as inserted foreign atoms, precipitate particles made up of the implanted atoms only, or as particles of intermetallic compounds involving the implanted species and the host metal atoms. The aforementioned may depend on the processing specifics and the temperature/time exposure history. The desired post-implantation annealing heat treatment may be performed at a temperature ranging from about 80° C. to about 500° C. for a time period ranging from about 0.1 hours to about 10,000 hours. In an exemplary embodiment, the post-implantation annealing heat treatment is conducted at a temperature ranging from about 100° C. to about 300° C. for a duration ranging from about 0.5 hours to about 100 hours. Likewise, an inert gas or vacuum environment is preferred, especially for heat treatments above 200° C.

Figure 6:
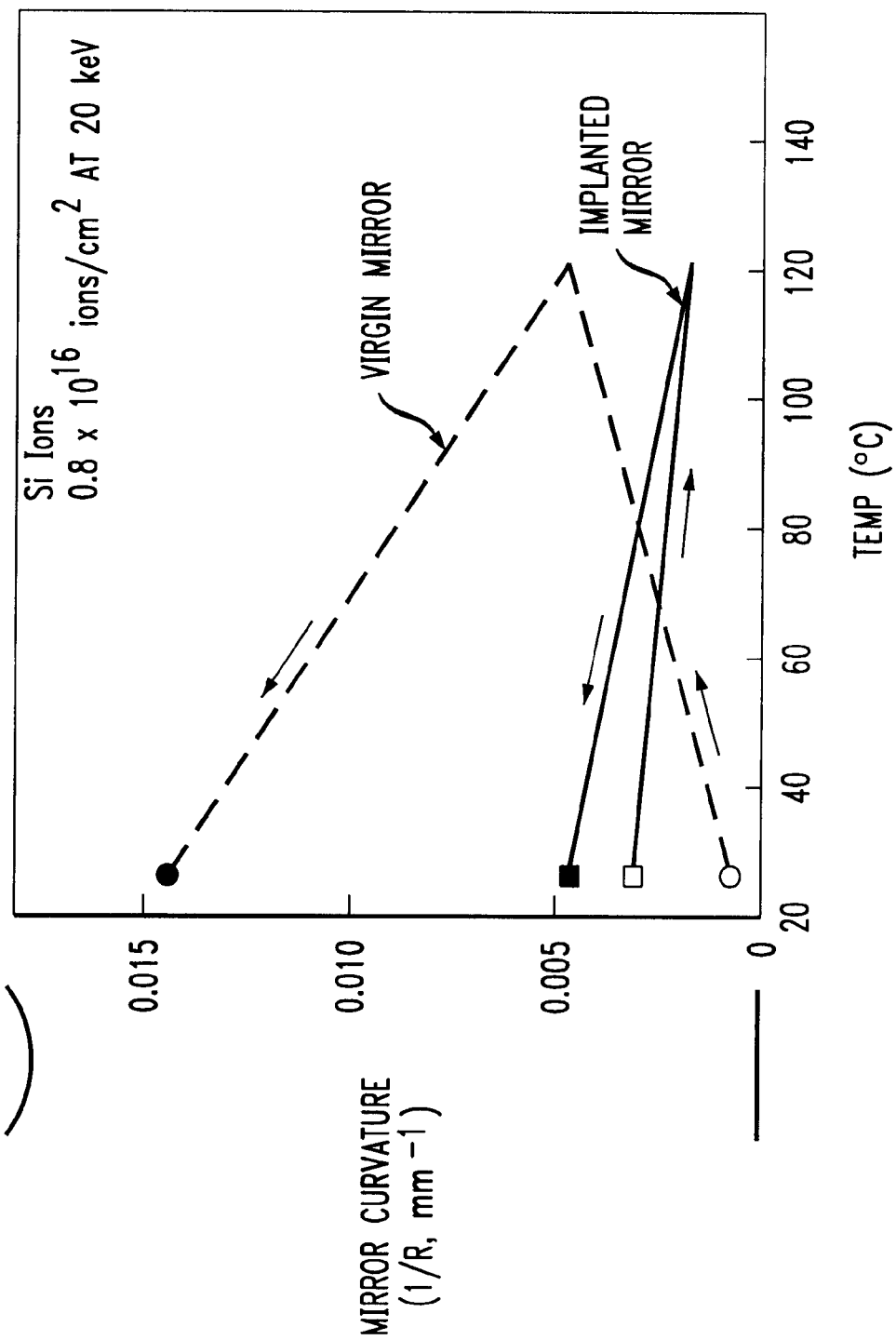
FIG. 6 illustrates the mirror-curvature-stabilizing effect of Si ion implantation into gold.

Shown in FIG. 6 is comparative mirror stability data for the electro-optic device 100, such as shown in FIG. 1. The mirror curvature, which is a measure of the degree of bowing from the flat mirror with diameter R, is expressed as 1/R and is measured, e.g., using an optical interferometer technique as a function of a test temperature between room temperature and 120° C. The exposure of the mirrors in the optical cross-connect device to a different temperature environment is unavoidable as the ambient temperature, the device temperature in electronic circuit environment, as well as the temperature exposure during the product storage or shipping, are subject to change. The 1/R versus temperature data for the virgin (unimplanted) light reflective optical layer 310 mirrors are plotted in FIG. 6 as a dotted curve, which is compared with the solid curve data for the Si$^+$ ion implanted light reflective optical layer 310 mirrors. The Si$^+$ion implantation was carried out with a dose of about $0.8 \times 10^{16}$ ions/cm$^2$ at about 20 KeV extraction voltage. The data for the virgin (unimplanted) light reflective optical layer 310 was taken from other mirrors in the adjacent area on the same device but was locally shielded from the ion implantation by placing a blocking cover over the area. As is evident from FIG. 6, the mirror curvature in the case of the virgin light reflective optical layer 310 is increased significantly during the first heating cycle to about 120° C. and cooling back to room temperature with the shift of about 0.014/mm$^{-1}$ in the 1/R value. By contrast, the ion implanted light reflective optical layer 310 mirror exhibits a very small shift in the mirror curvature upon the same temperature excursion. Actually, it exhibits a shift in the 1/R value of about 0.0015/mm$^{-1}$, which is almost an order of magnitude smaller change. The result is that the mirror curvature for the device is substantially reduced by the Si$^+$ ion implantation, almost by a factor of 3. Upon subsequent heating and cooling cycles, it was found that the mirror curvature of both the virgin and the implanted device more or less follows the slope of the previous cooling cycle shown in FIG. 6, with a rather small and gradual increase of the curvature upon repeated thermal cycles. It is also notable from FIG. 6 that the implanted mirror desirably exhibits temperature dependent change of mirror curvature, the degree of which is substantially reduced (by a factor of about 2), as compared to that for the virgin mirror. For a given specification of allowable drift in mirror curvature, the implanted mirror provides a better reliability by allowing for a greater temperature variation during service.

Figure 7:
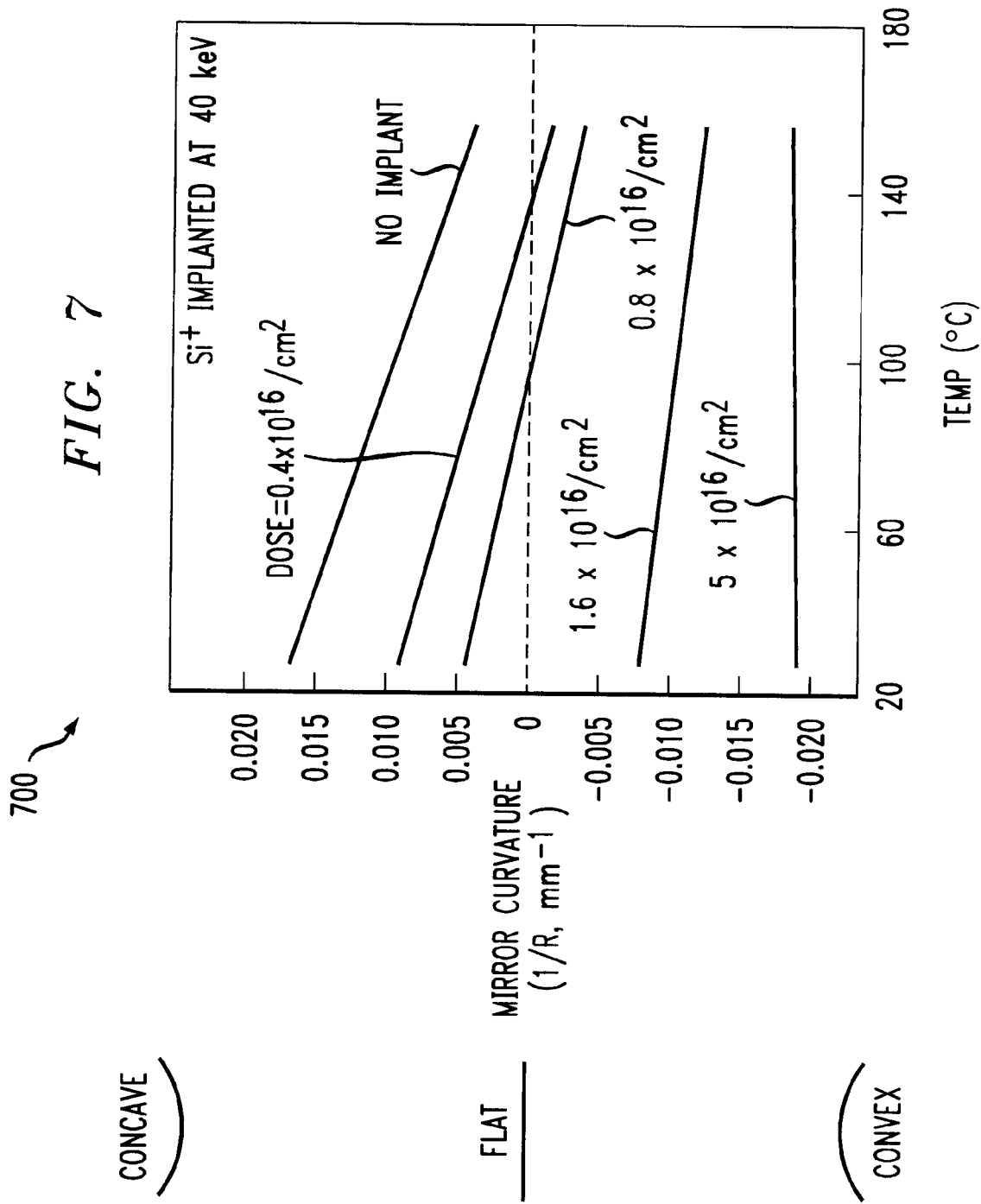
FIG. 7 illustrates the experimental data showing the effect of Si ion implantation dose on the temperature dependence of mirror curvature.

FIG. 7 represents the experimental data showing the effects of different Si$^+$ ion implantation doses on the temperature-dependence of mirror curvature. As the implant dose is increased, the initially concave mirror curvature at room temperature is gradually opened up toward the flat mirror at a dose of about 1E16 ions/cm$^2_1$, and then the trend of mirror opening up continues further into convex state at higher doses of implantation. Thus a selection of proper implant dose can be utilized to conveniently fine tune and adjust the mirror curvature if the starting curvature is concave in nature. It is also noteworthy from FIG. 7 that the temperature-dependence of mirror curvature, i.e., the slope of the thermal cycling curves, is substantially reduced by implantation, with the degree of reduction increasing with increasing dose of implantation. At a dose of about 5E16 ions/cm$^2$, this reaches near zero or even a slightly positive temperature-dependence. The exact cause for the reduced temperature-dependence of curvature by ion implantation is not clearly understood, but it may be related to the strengthened light reflective optical layer 310, the altered coefficients of thermal expansion in the light reflective optical layer 310 and in the polysilicon mirror substrate 210, and also to the additional tensile stress introduced in the light reflective optical layer 310 as well as in the surface region of the polysilicon mirror substrate 210.

The ion implanting may optionally be performed by blanket implantation on the whole or on a large area portion of the device surface, or may be performed only on selected areas (e.g., only where the light reflective optical layer 310 is present). This could be accomplished by patterned masking, depending on the convenience of fabrication processing. The ion implanted mirror array may be used as-implanted, or after being subjected to additional annealing heat treatment. For example, this could be done to facilitate the formation of precipitate particles in the light reflective optical layer 310 or to intentionally allow creep deformation so that time or temperature-dependent change of mirror curvature during service is minimized.

According to the invention, the structure of atomic arrangement in the light reflective optical layer 310 and a surface portion of the mirror substrate 210 are altered by the implanted dopant 410. The implantation inserts foreign atoms into the lattice structure of the host material thus increasing the tensile stress in the light reflective optical layer 310, and the mirror substrate 210 if the implanting ions penetrate somewhat into the mirror substrate 210 as well. Induced tensile stress on the surface portion of the thin materials tends to correct the concave curvature of the mirror structure toward a desirably flat configuration. The process of doping the light reflective optical layer 310 may introduce, in addition to the implanted atoms or precipitate particles, other defects such as dislocations and point defects in the lattice structure of the light reflective optical layer 310, and mirror substrate 210 if included therein. Furthermore, the dopant strengthens the otherwise very soft light reflective optical layers 310 and reduces the undesirable time or temperature-dependent curvature change.

Figure 8:
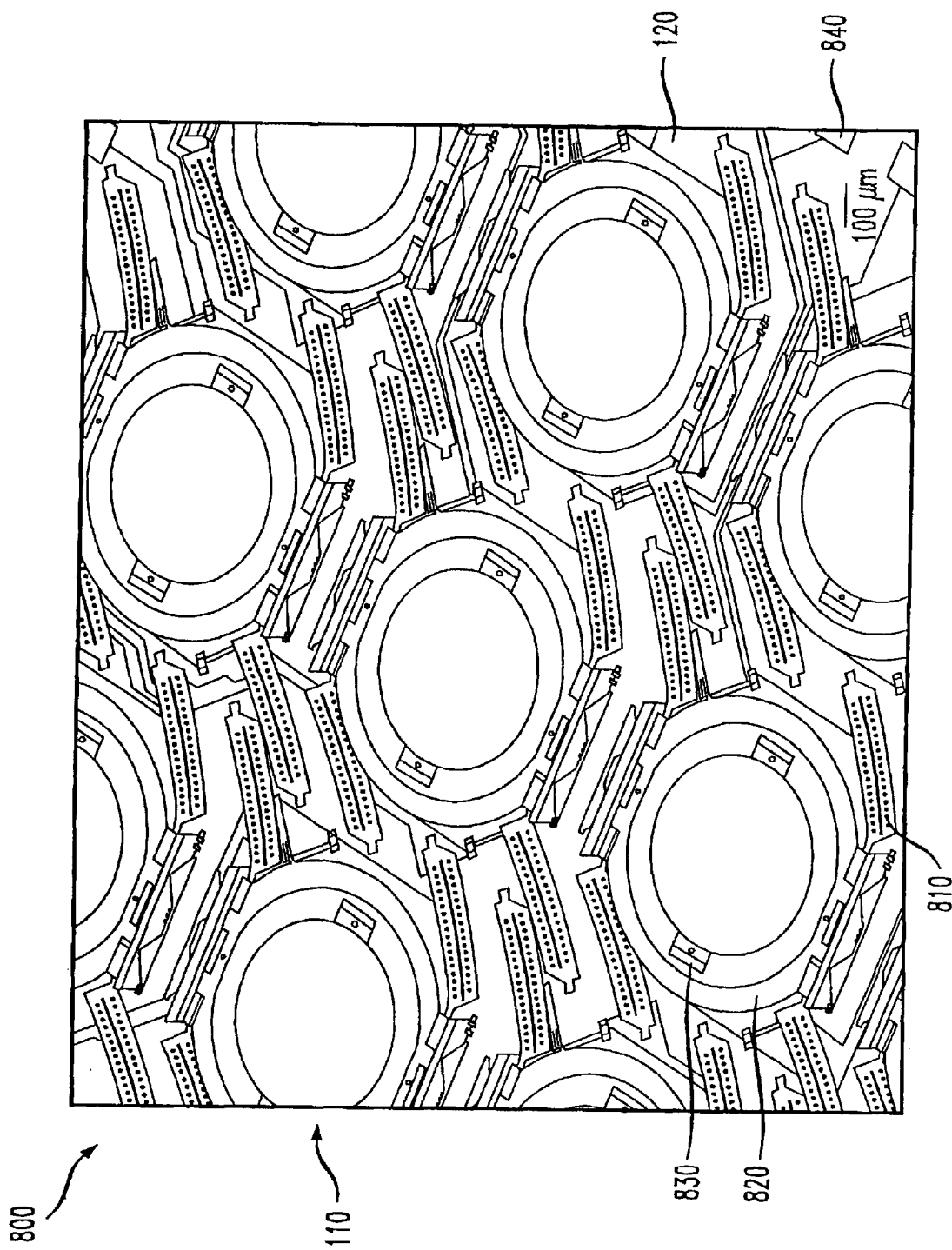
FIG. 8 illustrates a photomicrograph showing an exemplary electro-optic device comprising an array of improved mirror structure according to the invention.

Turning to FIG. 8 with continued reference to FIG. 1, illustrated is a photomicrograph showing an exemplary electro-optic device 800 comprising an array of mirrors 110. The device 800 was fabricated by MEMS micro machining process which involves multilayer deposition and selective etching. The mirror assembly 110 is raised above the mounting substrate 120 by using the upward bending of lift arms 810 during the release process for the MEMS structure. The mirrors 110 in this particular embodiment, are double gimbal cantilevered and attached onto a frame structure 820 by springs 830, and hence can be tilted to any desired orientation for optical signal routing via electrostatic or other actuation with electrical voltage or current supplied from outside, e.g., through contact pads 840. The inventive mirror 110 illustrated in FIG. 1, is dimensionally stabilized in terms of flatness by the ion implantation. Thus, the mirror 110 exhibits substantially reduced time- and temperature-dependent change of mirror curvature.

Figure 9:
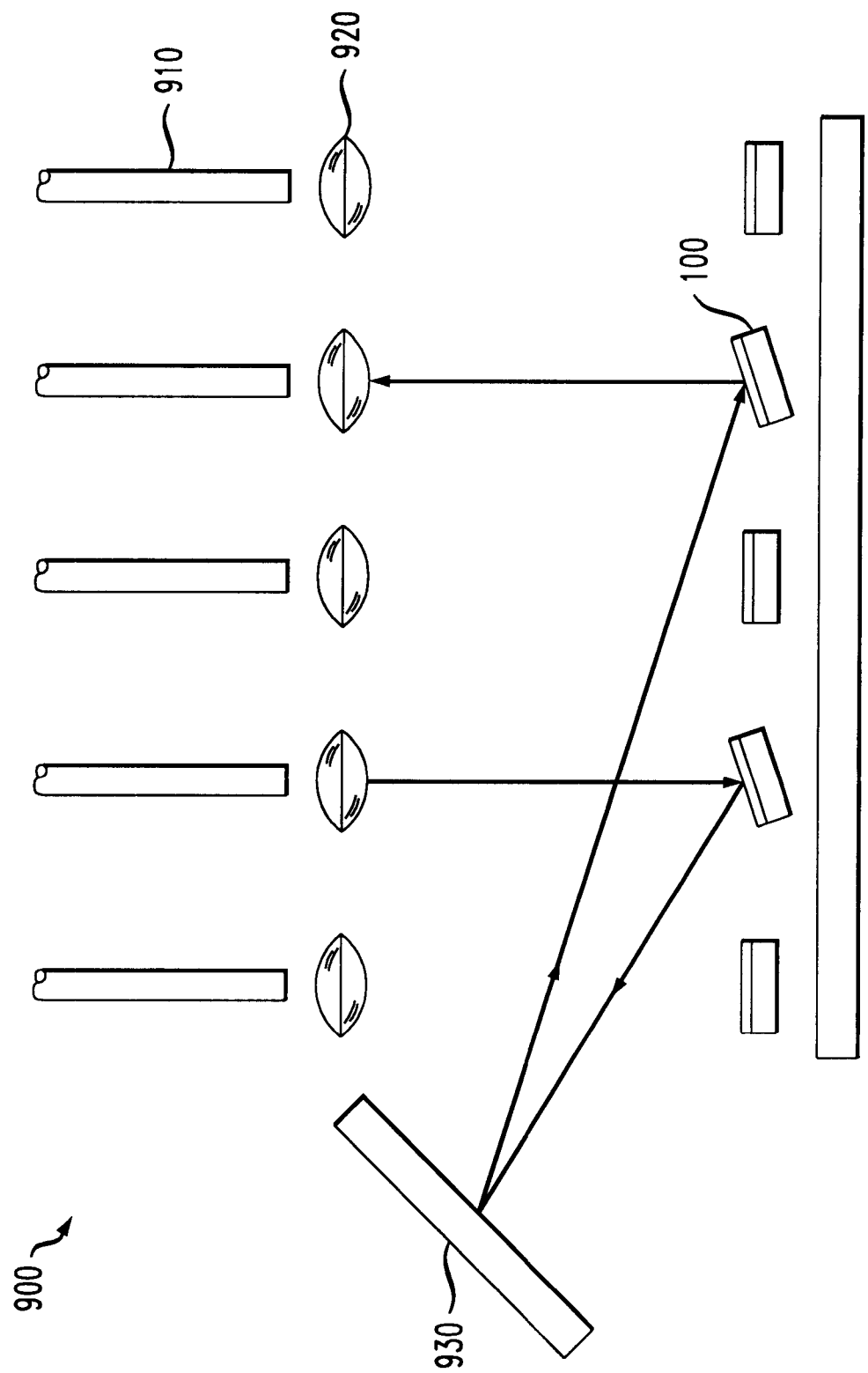
FIG. 9 illustrates an optical communications system, which provides one environment where the micro-electro-mechanical structure may be used.

Turning to FIG. 9, illustrated is an optical communications system 900. In the embodiment shown in FIG. 9, the optical communications system 900 includes input/output fiber bundles 910, the micro-electro-mechanical structure 100 illustrated in FIG. 1, an imaging lense 920 interposed between the input/output fiber bundles 910 and the micro-electro mechanical structure 100, and a reflector 930. The optical communications system 900 represents an optical cross-connect, which is one environment where the micro-electro-mechanical structure 100 may be used.

Figure 10:
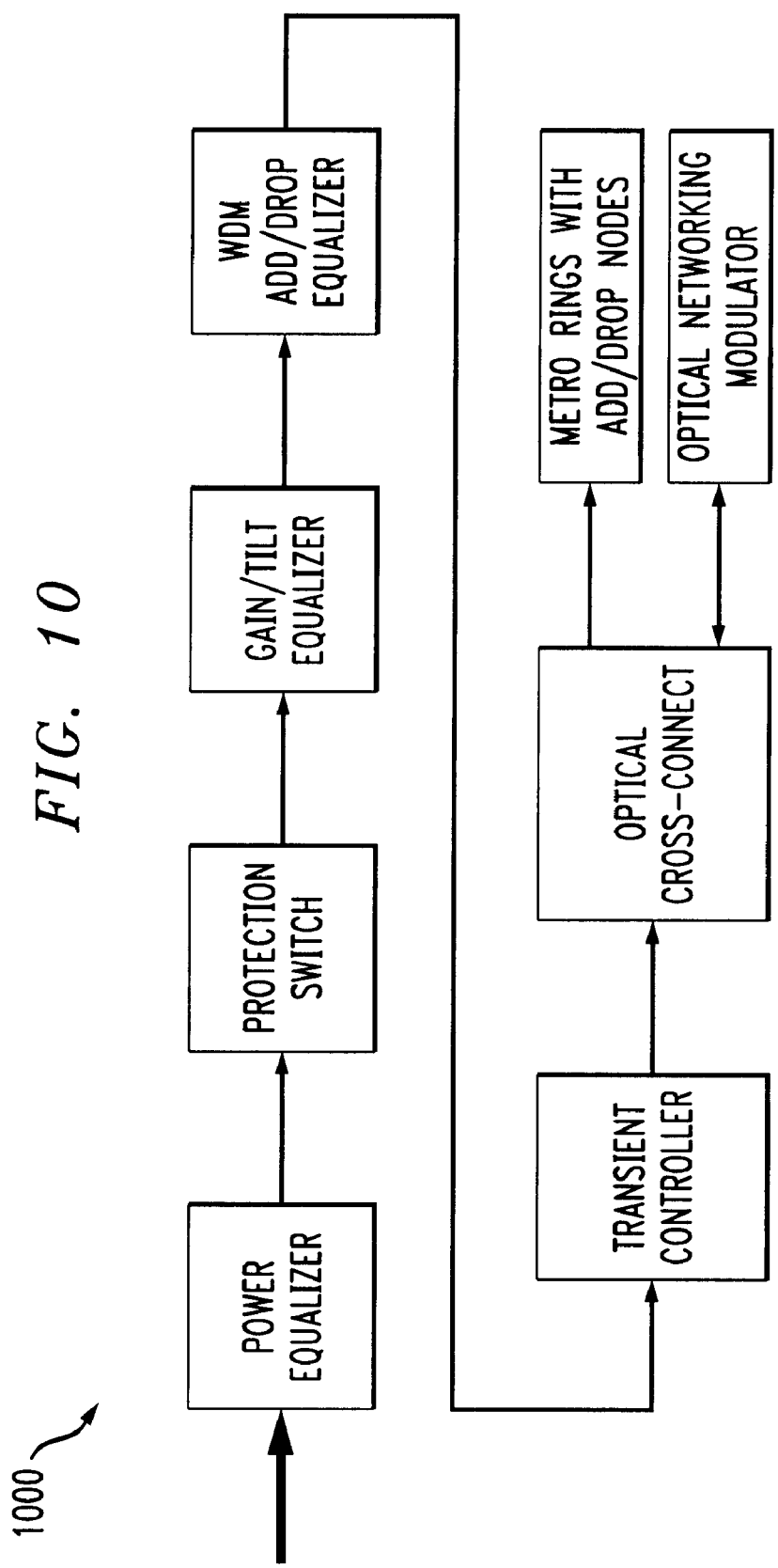
FIG. 10 illustrates an optical networking system incorporating the inventive electro-optic mirror cross connect devices.

The inventive micro-electro-mechanical system optical device 100, with stabilized mirror arrays, is useful not only for channel cross-connect, but also for signal re-routing, or signal modification in optical communication networking system. Schematically illustrated in FIG. 10 is an example of such a communication system 1000 comprising an optical cross connect and other functional devices. In the cross connect, each mirror receives a demultiplexed optical signal from an incoming channel, and reflect it toward an intended output channel location. The inventive device is also useful for various other light-reflecting mirror systems, since the stability of mirror curvature is essential for reliable operation of most of the MEMS based optical devices. Examples of such devices include those shown in FIG. 10, such as power gain equalizers, switches, wavelength-division-multiplexer (WDM) add/drop devices, optical modulators and optical signal attenuators.

Multi-wavelength optical communication systems will require reconfiguration and reallocation of wavelengths among the various nodes of a network depending on user requirements, e.g., with programmable add/drop elements. One problem limiting the capacity of such systems is that the erbium-doped fiber amplifier, which is often a necessary component in optical communication systems, has a characteristic spectral dependence providing different gain for different wavelength channels. This spectral dependence poses a problem for multichannel WDM systems, because different gains for different channels leads to high bit error rates in some of the channels. As the number of channels passing through the amplifier changes by channel add/drop reconfiguration, the amplifier will start showing deleterious peaks in its gain spectrum at some wavelength channels, requiring modification of the signal spectrum and flattening of the amplifier gains.

One way of flattening the amplifier gain spectrum is to use long period fiber gratings. Long-period fiber grating devices provide wavelength dependent loss and may be used for spectral shaping. See an article by A. M. Vengsarkar et al., *Optical Letters* Vol. 21, p. 336, (1996). A long-period grating couples optical power between two co-propagating modes with very low back reflections. A long-period grating typically comprises a length of optical waveguide wherein a plurality of refractive index perturbations are spaced along the waveguide by a periodic distance, which is large compared to the wavelength of the transmitted light. Long-period fiber grating devices selectively remove light at specific wavelengths by mode conversion. In contrast with conventional Bragg gratings in which light is reflected and stays in the waveguide core, long-period gratings remove light without reflection, as by converting it from a guided mode to a non-guided mode. A non-guided mode is a mode which is not confined to the core, but rather, is defined by the entire waveguide structure, e.g., based on a cladding mode.

A difficulty with conventional long-period gratings, however, is that their ability to dynamically equalize amplifier gain is limited, because they filter only a fixed wavelength acting as wavelength-dependent loss elements. Such dynamic gain equalizers based on reconfigurable long-period gratings have been disclosed, for example, in the U.S. Pat. No. 5,999,671 (Jin, et al.). It is desirable to be able to equalize amplifier gains over a broad range of wavelengths covering many wavelength channels. Therefore, it would be beneficial to utilize the micro-electro-mechanical system optical device 100, and design dynamic gain equalizer devices so that the range of wavelength spectrum and the number of wavelength channels simultaneously controllable can be increased.

In the inventive dynamic gain equalizer, based on the micro-electro-mechanical system optical device 100, the optical signal gain in each wavelength channel can be independently, and simultaneously with other channels, controlled by the micro-electro-mechanical system optical device 100, which reflects that particular signal. The multiplexed optical is demultiplexed using suitable demultiplexers such as planar waveguides or thin film devices, with each of the separated wavelength channel signal being sent to each micro-electro-mechanical system optical device 100 and reflected. By programmably selecting the tilt angle of relevant mirrors slightly off the angle of maximum signal reflection, the losses for various channels can be intentionally increased to different degrees for the purpose of gain equalizing. The stability of mirror curvature enhanced by the inventive ion implantation is crucial in ensuring the accuracy of dynamic gain control by different mirrors.

Figure 11:
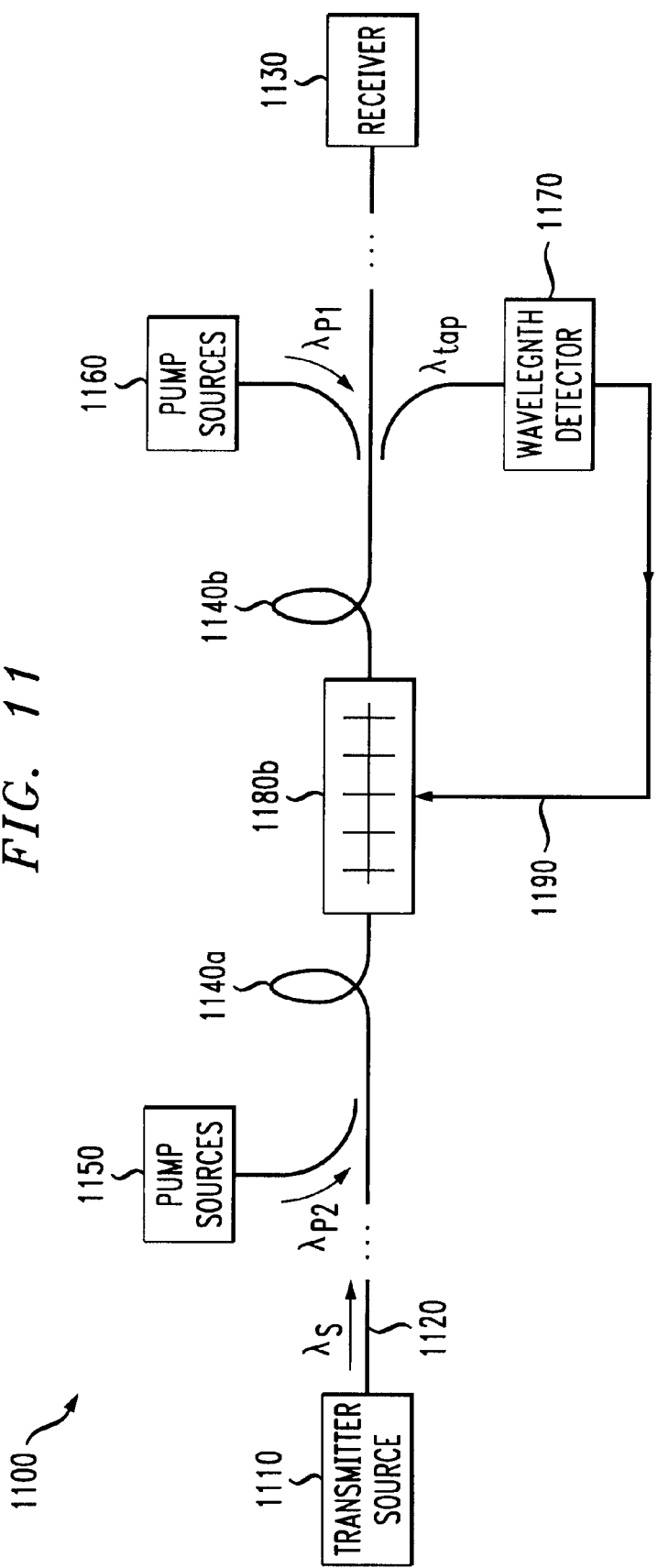
FIG. 11 illustrates an optical communication system comprising a dynamic gain equalizer according to the invention.

Referring to FIG. 11, illustrated is an exemplary optical communication system comprising the micro-electro-mechanical system optical device 100 according to the invention. The system 1100 comprises dynamically gain-equalized optical amplifiers, a reconfigurable MEMS mirror-type spectral shaping device, and a feedback device. Specifically, the system 1100 comprises a transmitter source 1110 of optical signals such as a digitally modulated 1.55 mm signal, an optical signal path comprising a length of optical fiber 1120 for transmitting the signal, and a receiver 1130 for receiving and demodulating the signal. One or more optical amplifiers, such as erbium-doped fiber amplifiers 1140a, 1140b, are disposed in the optical signal path for amplifying the transmitted signal. The amplifiers are pumped by pump sources 1150, 1160, of optical energy having pump wavelengths $\lambda_{p1}$ and $\lambda_{p2}$.

One of the preferred uses of the device of FIG. 11 is to reduce spectral dependence in the gain output of an optical amplifier. For example, the characteristic gain spectrum of an erbium-doped optical fiber amplifier has a pair of gain peaks at about 1.53 mm and at about 1.56 mm. Thus, a signal at 1.53 mm will be amplified more than one at 1.54 mm, which would be disadvantageous in a wavelength division multiplexing (WDM) system.

By properly demultiplexing the optical signal and sending it to different light-reflecting mirrors for separately programmed attenuation of signal strengths, and by optional tuning of the mirror reflections via a feedback system, the gain spectrum of the amplifier device combination can be made substantially flat over a range of wavelengths. The tunable system 1180 comprises a demultiplexer in combination with a tunable light-reflecting MEMS mirror device and a multiplexer to put together the different wavelength channels into the optical fiber. The device 1180 is connected to a feedback system 1190, having a wavelength detector 1170 coupled to the fiber 1120 for detecting the wavelength response $\lambda_{tap}$. The feedback system 1190 automatically adjusts the tuning of the device 1180 depending upon $\lambda_{tap}$. Advantageously, system 1100 can be a WDM system using a plurality of different wavelength signals, e.g. $\lambda_{s1}$ and $\lambda_{s2}$, and a plurality of tunable MEMS mirror devices coupled to one or more detectors.

The micro-electro-mechanical system optical device 100 can also be useful as a multi-channel optical add/drop device. Modern, high-density optical communications utilize wavelength division multiplexed communication systems which employ multiplexer/demultiplexer devices. In such systems, a "trunk" fiber carries optical signal channels at several wavelengths $\lambda_1, \lambda_2, \ldots \lambda_n$ and it is desirable to extract a single wavelength channel from the trunk fiber or to add a single wavelength channel onto the trunk. A wide variety of such devices can be made, for example, by interconnecting optical circulators and tunable fiber Bragg gratings. See, U.S. Pat. No. 5,781,677 by Jin et al. Typically the channel reflected by the grating is dropped to the trunk fiber or is added to the trunk. Gratings as described herein permit selection at the grating of which channel is dropped or added. The micro-electro-mechanical system optical device 100 allows channel add/drop operation in a free-space mode thus providing a convenient capability to carry out the add/drop operations for many hundreds or even thousands of channels simultaneously.

Filters and attenuators are useful in communication systems to change the power levels of various signals. In modern communications systems, variable attenuators are becoming increasingly more important, especially in dense wavelength-division multiplexed (DWDM) systems. Variable attenuators are used to vary the amount of loss, light will experience as it passes through the system. This loss may range from low loss (<1 dB), to very high loss (>30 dB). The mechanism by which the attenuators induce loss in the signals may be attributable to coupling loss between fibers, polarization loss, absorption loss, scattering loss, or any combination of these.

Variable attenuators typically include complicated structures with moving parts that rotate or otherwise move the position of the fibers or a separate attenuator device. For example, U.S. Pat. No. 5,745,634 to Garrett, et al.,"Voltage Controlled Attenuator," issued Apr. 28, 1998, shows a variable attenuator with which the variation in attenuation is obtained by actuating a DC motor which displaces the position of the attenuator. U.S. Pat. No. 5,677,977 to Smith, "Optical Attenuator," issued Oct. 14, 1997, shows a variable attenuator with which the variation in attenuation is obtained by providing a circular loop of optical fiber which is rotated with use of a lockable rotating shaft clamped to the side of the loop. U.S. Pat. No. 5,781,341 to Lee, "Motorized Tunable Filter and Motorized Variable Attenuator," issued Jul. 14, 1998, shows a variable attenuator with use of a cam attached to a collimator; the cam rotates the collimator to adjust the loss.

A variable attenuator based on coupling loss is typically composed of two separated fibers whose separation is controlled with mechanical motion. As the amount of the separation between the fibers increases, the amount of loss also increases. See, for example, Brenner et al., "Low-Reflectivity In-Line Variable Attenuator Utilizing Optical Fiber Tapers," *J. LIGHTWAVE TECH.*, Vol. 18 (1990), at p. 7, and U.S. application Ser. No. 09/097,549, "Magnetically Controlled Variable Optical Attenuators," filed by Espindola et al. on Jun. 15, 1998, and assigned to the present assignee, which is incorporated herein by reference.

Figure 12:
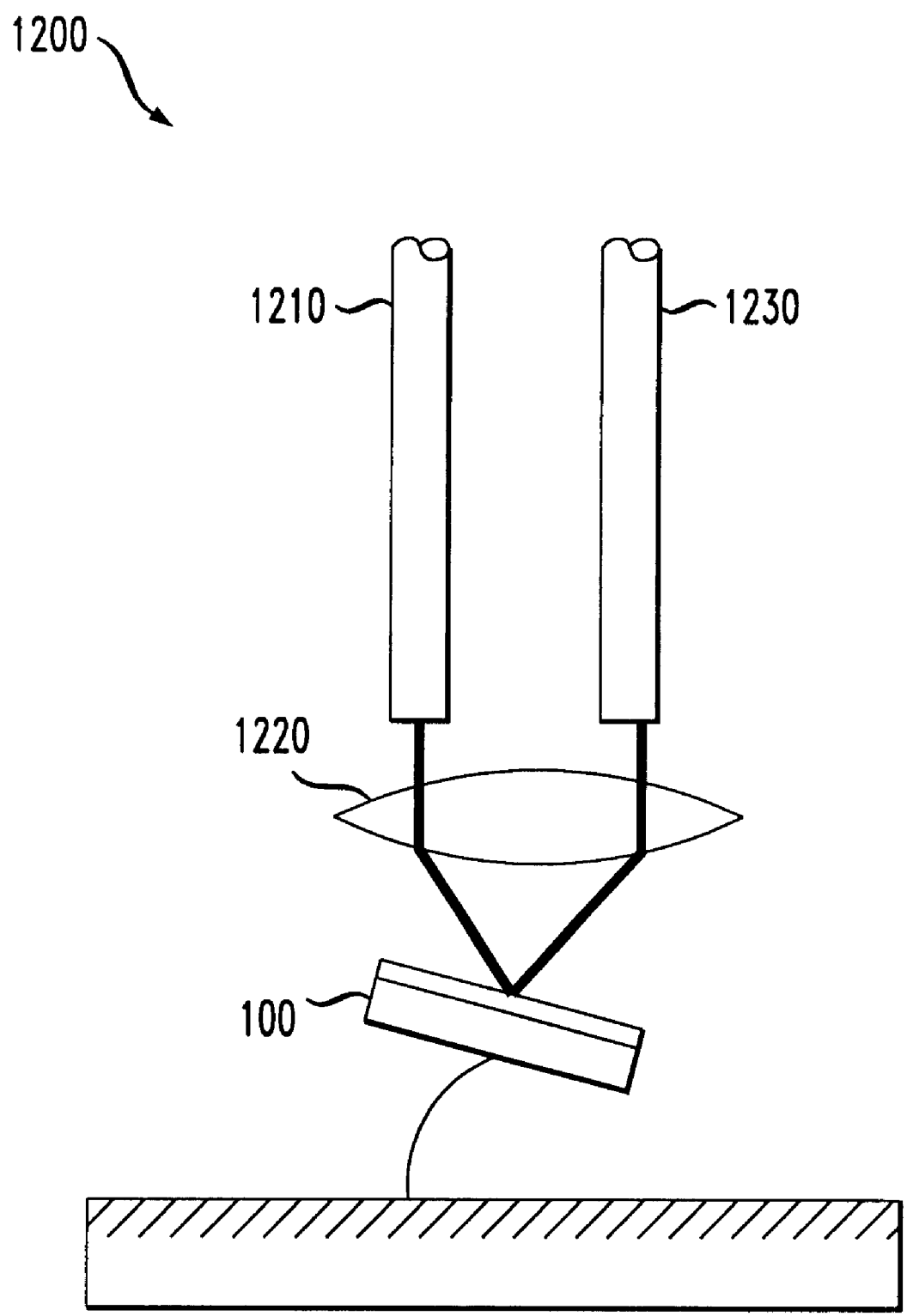
FIG. 12 illustrates an optical signal modulator comprising the improved mirror structure according to the invention.

As can be seen, variable attenuators typically have involved use of bulk moving parts and are not always amenable to small, high-density device arrays. As may be appreciated, those concerned with the development of optical communications systems continually search for new components and designs including new attenuator designs. As optical communications systems become more advanced, there is growing interest in reducing the dimension of the attenuator devices, and in increasing the number of wavelength channels that may be transmitted, relayed, modulated/attenuated, filtered, or switched. The instant invention comprising a micro-electro-mechanical system optical device 100, such as schematically illustrated in FIG. 12, provides a variable attenuator device that may be used to reliably achieve desired signal attenuation in many channels. Also included within the embodiment shown in FIG. 12, are a first fiber optic line 1210, a lense 1220, the micro-electro-mechanical system optical device 100 and a second offset fiber optic line 1230.

The inventive methods and structures can also be applied to devices which are not MEMS type devices. Any light-reflecting system comprising a mirror or an array of mirrors with surface light reflecting metal film can be improved by the insertion of the implanted dopant. For example, the mirror size may be larger than about 1 cm in diameter.

Although the present invention has been described in detail, those skilled in the art should understand that they can make various changes, substitutions and alterations herein without departing from the spirit and scope of the invention in its broadest form.

What is claimed is:

1. A micro-electro-mechanical system (MEMS) optical device, comprising:
    a mirror having a light reflective optical layer containing at least one type of an implanted dopant located over a substrate; and
    a mounting substrate on which the mirror is movably mounted.

2. The micro-electro-mechanical system (MEMS) optical device recited in claim 1 further including an adhesion layer located between the substrate and the light reflective optical layer.

3. The micro-electro-mechanical system (MEMS) optical device recited in claim 2 further including at least one type of dopant located within at least a portion of the adhesion layer and the substrate.

4. The micro-electro-mechanical system (MEMS) optical device recited in claim 3 wherein the dopant located within at least a portion of the adhesion layer is present in a concentration of at least about 1E14 atoms /cm$^3$.

5. The micro-electro-mechanical system (MEMS) optical device recited in claim 4 wherein the dopant located within at least a portion of the adhesion layer is present in a concentration of at least 1E17 atoms/cm$^3$.

6. The micro-electro-mechanical system (MEMS) optical device recited in claim 1 wherein the dopant concentration in the light reflective optical layer is at least about 1E15 atoms/cm$^3$.

7. The micro-electro-mechanical system (MEMS) optical device recited in claim 1 wherein the at least one type of implanted dopant has a solid solubility in the light reflective optical layer that is less than about 1 atomic percent.

8. The micro-electro-mechanical system (MEMS) optical device recited in claim 7 wherein the solid solubility is less than about 0.3 atomic percent.

9. The micro-electro-mechanical system (MEMS) optical device recited in claim 1 wherein the light reflective optical layer comprises a material selected from the group consisting of gold, silver, rhodium, platinum, copper, aluminum or a combination thereof.

10. The micro-electro-mechanical system (MEMS) optical device recited in claim 9 wherein the doped light reflective optical layer is doped with silicon and wherein the dopant concentration in the light reflective optical layer ranges from about 1E15 atoms/cm$^3$ to about 1E22 atoms/cm$^3$.

11. The micro-electro-mechanical system (MEMS) optical device recited in claim 10 wherein the dopant concentration in the light reflective optical layer ranges from about 1e17/cm$^3$ to about 1E20 atoms/cm$^3$.

12. The micro-electro-mechanical system (MEMS) optical device recited in claim 1 wherein the light reflective optical layer comprises gold.

13. The micro-electro-mechanical system (MEMS) optical device recited in claim 12 wherein the at least one type of implanted dopant comprises one or more elements selected from the group consisting of:
    substitutional elements including silicon, bismuth, strontium, barium, cadmium, tungsten, iridium, rhenium, rhodium, ruthenium, cobalt, sulfur, selenium, tellurium, chlorine, iodine, phosphorous;
    interstitial elements including boron, carbon, nitrogen oxygen, fluorine and hydrogen;
    rare earth group elements including cerium, europium, erbium, lanthanum, neodymium, samarium, terbium; and
    gas atoms including helium, neon, argon and krypton.

14. The micro-electro-mechanical system (MEMS) optical device recited in claim 1 wherein the light reflective optical layer comprises silver.

15. The micro-electro-mechanical system (MEMS) optical device recited in claim 14 wherein the at least one type of implanted dopant comprises one or more elements selected from the group consisting of silicon, bismuth, strontium, barium, cadmium, chromium, tungsten, nickel, iridium, molybdenum, niobium, rhenium, rhodium, ruthenium, osmium, vanadium, cobalt, sulfur, selenium, tellurium, chlorine, phosphorous, boron, carbon, nitrogen, oxygen, fluorine, hydrogen, cerium, europium, gadolinium, lanthanum, neodymium, samarium, terbium, yttrium, helium, neon, argon and krypton.

16. The micro-electro-mechanical system (MEMS) optical device recited in claim 1 wherein the light reflective optical layer comprises aluminum.

17. The micro-electro-mechanical system (MEMS) optical device recited in claim 16 wherein the at least one type of implanted dopant comprises one or more elements selected from the group consisting of gold, barium, bismuth, cadmium, cobalt, chromium, iron, germanium, silicon, hafnium, vanadium, indium, iridium, molybdenum, nickel, lead, titanium, tungsten, palladium, platinum, rhenium, rhodium, ruthenium, sulfur, selenium, tellurium, antimony, tin, strontium, helium, neon, argon, krypton, chlorine, iodine, phosphorous, cerium, dysprosium, erbium, europium, gadolinium, holmium, lanthanum, lutetium, neodymium, samarium, terbium, yttrium, ytterbium, boron, carbon, nitrogen, oxygen, fluorine and hydrogen.

18. The micro-electro-mechanical system (MEMS) optical device as recited in claim 1 wherein the substrate comprises a material selected from the group consisting of polysilicon, single crystal silicon, silicon nitride, silicon carbide, silicon oxide, diamond film, or any regional and layered combination of these materials.

19. The micro-electro-mechanical system (MEMS) optical device as recited in claim 1 wherein at least one of the implanted dopants in the light reflective optical layer is in the form of isolated embedded atoms.

20. The micro-electro-mechanical system (MEMS) optical device as recited in claim 1 wherein at least one of the implanted dopants in the light reflective optical layer is in the form of clusters having a size ranging from about 1 nm to about 1000 nm.

21. The micro-electro-mechanical system (MEMS) optical device as recited in claim 20 wherein at least one of the implanted dopants in the light reflective optical layer is in the form of clusters having a size ranging from about 1 nm to about 100 nm.

22. A method of manufacturing a micro-electro-mechanical system (MEMS) optical device, comprising:
   forming a mirror having a light reflective optical layer containing at least one type of an implanted dopant located over a substrate-;-and
   forming a mounting substrate on which the mirror is movably mounted.

23. The method as recited in claim 22 further including forming an adhesion layer between the substrate and the light reflective optical layer.

24. The method as recited in claim 23 further including implanting at least one type of dopant within at least a portion of the adhesion layer and the substrate.

25. The method recited in claim 24 wherein implanting at least one type of dopant includes implanting at least one type of dopant within at least a portion of the adhesion layer and the substrate at a concentration of at least about 1E14 atoms/cm$^3$.

26. The method recited in claim 25 wherein implanting at least one type of dopant within at least a portion of the adhesion layer and the substrate at a concentration of at least about 1E14 atoms/cm$^3$ includes implanting at least one type of dopant within at least a portion of the adhesion layer and the substrate at a concentration of at least about 1E17 atoms/cm$^3$.

27. The method recited in claim 22 wherein the light reflective optical layer having at least one type of implanted dopant has a concentration of at least about 1E15 atoms/cm$^3$.

28. The method recited in claim 22 wherein the mirror comprises a material selected from the group consisting of gold, silver, rhodium, platinum, copper, aluminum and a combination thereof.

29. The method recited in claim 28 wherein at least one type of an implanted dopant comprises silicon and the light reflective optical layer has a silicon dopant concentration ranging from about 1E15 atoms/cm$^3$ to about 1E22 atoms/cm$^3$.

30. The method recited in claim 29 wherein the silicon dopant concentration is about 1E20 atoms/cm$^3$.

31. The method recited in claim 22 wherein the light reflective optical layer comprises gold.

32. The method recited in claim 31 wherein the light reflective optical layer comprises gold and includes an implanted dopant selected from the group consisting of:
   substitutional elements including silicon, bismuth, strontium, barium, cadmium, tungsten, iridium, rhenium, rhodium, ruthenium, cobalt, sulfur, selenium, tellurium, chlorine, iodine, phosphorous;
   interstitial elements including boron, carbon, nitrogen oxygen, fluorine and hydrogen;
   rare earth group elements including cerium, europium, erbium, lanthanum, neodymium, samarium, terbium; and
   gas atoms including helium, neon, argon and krypton.

33. The method recited in claim 22 wherein the light reflective optical layer comprises silver.

34. The method recited in claim 33 wherein the light reflective optical layer comprises silver and includes an implanted dopant selected from the group consisting of silicon, bismuth, strontium, barium, cadmium, chromium, tungsten, nickel, iridium, molybdenum, niobium, rhenium, rhodium, ruthenium, osmium, vanadium, cobalt, sulfur, selenium, tellurium, chlorine, phosphorous, boron, carbon, nitrogen, oxygen, fluorine, hydrogen, cerium, europium, gadolinium, lanthanum, neodymium, samarium, terbium, yttrium, helium, neon, argon and krypton.

35. The method recited in claim 22 wherein the light reflective optical layer comprises aluminum.

36. The method recited in claim 35 wherein the light reflective optical layer comprises aluminum and includes an implanted dopant selected from the group consisting of gold, barium, bismuth, cadmium, cobalt, chromium, iron, germanium, silicon, hafnium, vanadium, indium, iridium, molybdenum, nickel, lead, titanium, tungsten, palladium, platinum, rhenium, rhodium, ruthenium, sulfur, selenium, tellurium, antimony, tin, strontium, helium, neon, argon, krypton, chlorine, iodine, phosphorous, cerium, dysprosium, erbium, europium, gadolinium, holmium, lanthanum, lutetium, neodymium, samarium, terbium, yttrium, ytterbium, boron, carbon, nitrogen, oxygen, fluorine and hydrogen.

37. The method as recited in claim 22 wherein the substrate is polysilicon.

38. The method as recited in claim 22 wherein forming a mirror having a light reflective optical layer includes forming a mirror having a dopant located therein that is in the form of isolated embedded atoms.

39. The method as recited in claim 22 wherein forming a mirror having a light reflective optical layer includes forming a mirror having a dopant located therein that is in the form of clusters having a size ranging from about 1 nm to about 1000 nm.

40. The method as recited in claim 39 wherein the clusters have a size ranging from about 1 nm to about 100 nm.

41. The method as recited in claim 39 wherein forming a mirror having a dopant located therein that is in the form of clusters having a size ranging from about 1 nm to about 1000 nm includes subjecting the mirror to a heat treatment below about 400° C.

42. The method as recited in claim 22 wherein forming a light reflective optical layer includes forming a light reflective optical layer using a process selected from the group consisting of evaporation, sputtering, electrochemical deposition, chemical vapor deposition, followed by an ion implantation doping process with one or more dopants.

43. The method as recited in claim 22 wherein forming a light reflective layer includes using an extraction voltage for doping the light reflective layer such that at least 60% of the implanted dopant gets trapped and retained in the light reflective layer, with the remaining dopant penetrating into the substrate.

44. The method as recited in claim 43 wherein at least 90% of the implanted dopant gets trapped.

45. The method as recited in claim 43 wherein the extraction voltage is in the range from about 2 KeV to about 1000 KeV.

46. The method as recited in claim 45 wherein the extraction voltage is in the range from about 10 KeV to about 50 KeV.

47. The method as recited in claim 22 wherein forming a mirror having at least one type of an implanted dopant includes subjecting the mirror to an ion implantation technique.

48. The method as recited in claim 22 wherein forming a mirror having at least one type of an implanted dopant includes subjecting the mirror to a shadow mask or lithographic patterning process.

49. An optical communications system, comprising:
   input/output fiber bundles;
   a micro-electro-mechanical structure, comprising:
      a mirror having a light reflective optical layer containing at least one type of an implanted dopant located over a substrate; and a mounting substrate on which the mirror is movably mounted;

imaging lenses interposed between the input/output fiber bundles and the micro-electro-mechanical structure; and a reflector.

50. The optical communications system recited in claim 49 further including an adhesion layer located between the substrate and the light reflective optical layer.

51. The optical communications system recited in claim 49 wherein the at least one type of dopant is present in the light reflective optical layer in a concentration of at least about 1E15atoms/cm$^3$.

52. The optical communications system recited in claim 49 wherein the doped light reflective optical layer comprises a material selected from the group consisting of gold, silver, rhodium, platinum, copper, aluminum or a combination thereof.

53. The optical communications system recited in claim 49 wherein the light reflective optical layer comprises gold.

54. The optical communications system recited in claim 53 wherein the at least one type of dopant comprises one or more dopants selected from the group consisting of:

substitutional elements including silicon, bismuth, strontium, barium, cadmium, tungsten, iridium, rhenium, rhodium, ruthenium, cobalt, sulfur, selenium, tellurium, chlorine, iodine and phosphorous;

interstitial elements including boron, carbon, nitrogen oxygen, fluorine and hydrogen;

rare earth group elements including cerium, europium, erbium, lanthanum, neodymium, samarium, terbium; and gas atoms including helium, neon, argon and krypton.

55. The optical communications system recited in claim 49 wherein the light reflective optical layer comprises silver.

56. The optical communications system recited in claim 55 wherein the at least one type of dopant comprises one or more dopants selected from the group consisting of silicon, bismuth, strontium, barium, cadmium, chromium, tungsten, nickel, iridium, molybdenum, niobium, rhenium, rhodium, ruthenium, osmium, vanadium, cobalt, sulfur, selenium, tellurium, chlorine, phosphorous, boron, carbon, nitrogen, oxygen, fluorine, hydrogen, cerium, europium, gadolinium, lanthanum, neodymium, samarium, terbium, yttrium, helium, neon, argon and krypton.

57. The optical communications system recited in claim 49 wherein the light reflective optical layer comprises aluminum.

58. The optical communications system recited in claim 57 wherein the at least one type of dopant comprises one or more dopants selected from the group consisting of gold, barium, bismuth, cadmium, cobalt, chromium, iron, germanium, silicon, hafnium, vanadium, indium, iridium, molybdenum, nickel, lead, titanium, tungsten, palladium, platinum, rhenium, rhodium, ruthenium, sulfur, selenium, tellurium, antimony, tin, strontium, helium, neon, argon, krypton, chlorine, iodine, phosphorous, cerium, dysprosium, erbium, europium, gadolinium, holmium, lanthanum, lutetium, neodymium, samarium, terbium, yttrium, ytterbium, boron, carbon, nitrogen, oxygen, fluorine and hydrogen.

59. The optical communications system recited in claim 49 that comprises one or more devices selected from the group consisting of:

a micro-electro-mechanical system (MEMS) optical cross connect system;

an optical power gain equalizer system;

a wavelength division multiplexing telecommunications system;

a light signal switch in an optical communications system; and a variable optical attenuator in an optical communications system.

* * * * *